(12) United States Patent
Mallinson et al.

(10) Patent No.: US 10,637,640 B2
(45) Date of Patent: Apr. 28, 2020

(54) ASYNCHRONOUS DATA RECOVERY (71) Applicant: SiliconIntervention Inc., Kelowna (CA)

(72) Inventors: A. Martin Mallinson, Kelowna (CA); Christian Leth Petersen, Burnaby (CA)

(73) Assignee: SiliconIntervention Inc., Kelowna (CA)

( * ) Notice: Subject to any disclaimer, the term of this patent is extended or adjusted under 35 U.S.C. 154(b) by 0 days.

(21) Appl. No.: 16/517,621

(22) Filed: Jul. 21, 2019

(65) Prior Publication Data

US 2020/0028663 A1 Jan. 23, 2020

Related U.S. Application Data

(60) Provisional application No. 62/701,815, filed on Jul. 22, 2018, provisional application No. 62/701,816, filed on Jul. 22, 2018.

(51) Int. Cl.
*H04L 27/22* (2006.01)
*H04L 7/033* (2006.01)

(52) U.S. Cl.
CPC .................. *H04L 7/0331* (2013.01)

(58) Field of Classification Search
CPC .................................... H04L 7/0331
See application file for complete search history.

(56) References Cited

U.S. PATENT DOCUMENTS

| 7,031,686 | B2 * | 4/2006 | Kim | H03D 3/009 |
| | | | | 327/116 |
| 2010/0278285 | A1 * | 11/2010 | Lin | H04B 1/0032 |
| | | | | 375/327 |
| 2012/0099685 | A1 * | 4/2012 | Ritchey | H04B 1/0035 |
| | | | | 375/350 |
| 2012/0300888 | A1 * | 11/2012 | Mallinson | H03H 15/00 |
| | | | | 375/349 |

* cited by examiner

*Primary Examiner* — Dac V Ha
(74) *Attorney, Agent, or Firm* — Gard & Kaslow LLP (57) ABSTRACT

Described herein is an apparatus for the recovery of asynchronous data into a fixed clock domain. A phase-locked loop (PLL) of the known art is replaced by a modified quadrature resolver, and the output from the resolver recreates the selected frequency component of the input asynchronous data. The zero-crossings of this re-created data clock are used to sample the input data stream. One advantage of this technique is that it operates as a state machine on a single clock, and no analog components such as phase detectors or VCOs are needed. In another embodiment, the samples from the input data stream are changed from pulses to Gaussians, allowing for conversion of the sample rate from one clock domain to another.

14 Claims, 11 Drawing Sheets

ASYNCHRONOUS DATA RECOVERY

This application claims priority from Provisional Applications Nos. 62/701,815 and 62/701,816, both filed Jul. 22, 2018, which are incorporated by reference herein in their entirety.

FIELD OF THE INVENTION

The present invention relates generally to recovery of data in an input stream, and more particularly to the recovery of asynchronous data into a fixed clock domain.

BACKGROUND OF THE INVENTION

There are a number of applications in which it is desirable to recover data in an asynchronous data stream. As used herein, the term "asynchronous" implies that the regular events in the data stream are not synchronous to a "system" or master clock in a device, but the data is assumed to contain an average or dominant frequency.

Figure 1:
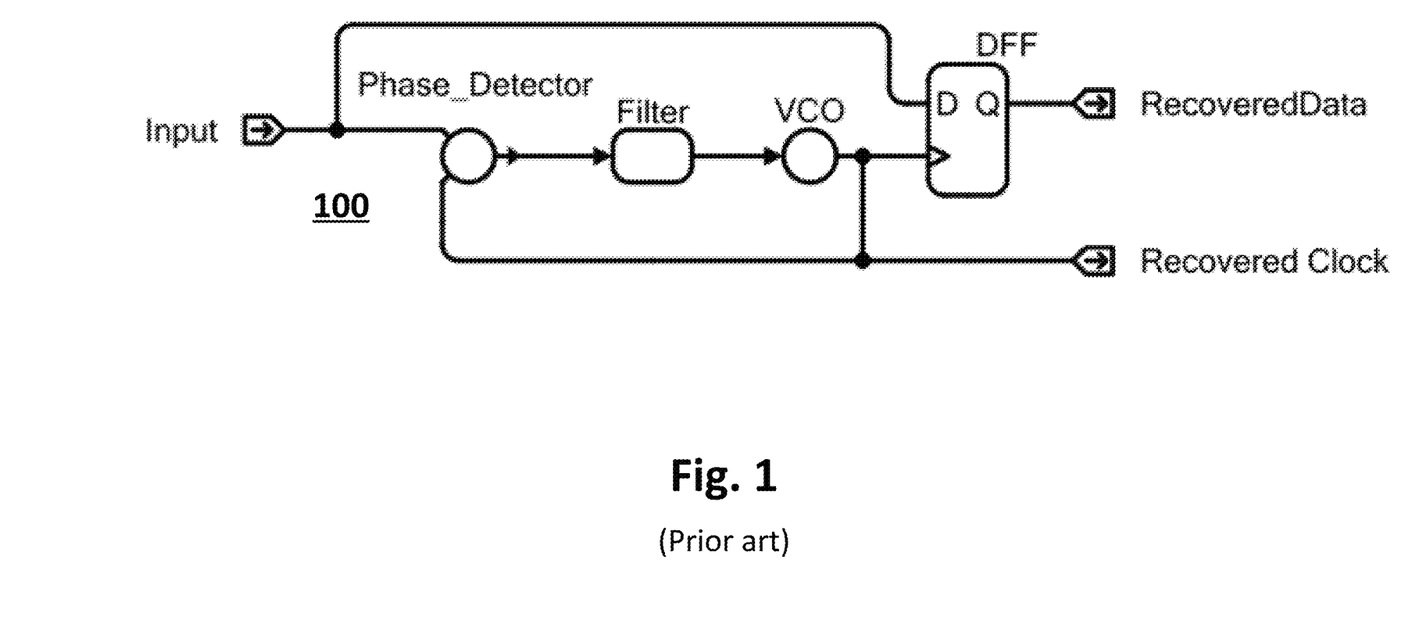
FIG. 1 is a diagram of a phase-locked loop as is known in the prior art.

A phase-locked loop ("PLL") is a well-known circuit used to generate a local data clock or "recovered clock" that is synchronous to the input data stream by locking onto the average or dominant frequency present in the input stream. The PLL typically has a phase detector, a filter, and a voltage-controlled oscillator ("VCO") that generates the "recovered clock" signal by locking on to the average or dominant frequency of the input stream. This allows the PLL to gather the data from the input stream, using, for example, a D-type flip-flop ("DFF") as shown in FIG. 1.

However, a device or system typically has a system or master clock, and the "recovered clock" generated by the PLL method of recovery of data generally does not have the same frequency as the master clock. Thus, data received from the input stream must be further processed to ensure that the system and the recovered data from the input stream remain in step with each other.

In addition, there are a number of issues around both VCOs and phase detectors. Both VCOs and certain types of phase detectors suffer from jitter, which may be perceptible as a degradation of the recovered data from the input signal. Some types of phase detectors may suffer from a "false lock" condition in which the PLL synchronizes with the wrong phase of the input signal or with the wrong frequency (e.g., a harmonic of the input signal), while other types of phase detectors suffer from a "dead band" (in which the phases of inputs are close enough that the detector fires on either both or neither of the appropriate charge pulses). (While the filter is also important for smoothing the output of the phase detector, those of skill in the art will easily be able to select an appropriate filter.)

As a result of these issues, those of skill in the art will appreciate the various, often complicated, design considerations that must go into the implementation of a PLL.

For these and other reasons, it is desirable to have a way of recovering asynchronous data at the frequency of the input data stream while using a single clock, and without analog components such as phase detectors or VCOs.

SUMMARY OF THE INVENTION

The present application describes an apparatus for asynchronous data recovery using a single clock and without any analog components.

One embodiment describes a circuit comprising: an oscillator having a sine output configured to provide a sine signal at an expected frequency of an input signal and a cosine output configured to provide a cosine signal at the expected frequency of the input signal; a first multiplier having a first input coupled to the sine output of the oscillator and a second input configured to receive the input signal, and an output configured to provide a product of the sine signal and the input signal; a second multiplier having a first input coupled to the cosine output of the oscillator and a second input configured to receive the input signal, and an output configured to provide a product of the cosine signal and the input signal; a first low pass filter having an input coupled to the first multiplier and an output configured to provide a first filtered signal; a second low pass filter having an input coupled to the second multiplier and an output configured to provide a second filtered signal; a third multiplier having a first input coupled to the sine output of the oscillator and a second input coupled to the output of the first low pass filter, and an output configured to provide a product of the sine signal and the first filtered signal; a fourth multiplier having a first input coupled to the cosine output of the oscillator and a second input coupled to the output of the second low pass filter, and an output configured to provide a product of the cosine signal and the second filtered signal; and an adder having a first input coupled to the output of the third multiplier and a second input coupled to the output of the fourth multiplier, and an output configured to provide a sum of the output of the third multiplier and the output of the fourth multiplier.

DETAILED DESCRIPTION OF THE INVENTION

Described herein is an apparatus for the recovery from a data stream of asynchronous data into a fixed clock domain. A phase-locked loop (PLL) of the known art is replaced by a modified quadrature resolver, and the output from the resolver re-creates the selected frequency component of the input asynchronous data. The zero-crossings of this re-created data clock are used to sample the input data stream. One advantage of this technique is that it uses a state machine on a single clock, and no analog components such as phase detectors or VCOs are needed.

FIG. 1 is a diagram of a phase-locked loop ("PLL") 100 as known in the prior art. As above, the input stream is assumed to be an asynchronous stream of bits (all of the inputs herein are similarly assumed to be asynchronous bit streams). As shown in FIG. 1 and as is typical in the art, PLL 100 has a phase detector, a filter, and a voltage-controlled oscillator ("VCO") that generates the "recovered clock" ("Recovered Clock" in FIG. 1) signal by locking on to the average or dominant frequency of the input stream. This allows PLL 100 to gather or recover the data from the input stream at its average or dominant frequency, using, for example, a D-type flip-flop ("DFF") as shown in FIG. 1.

Figure 2:
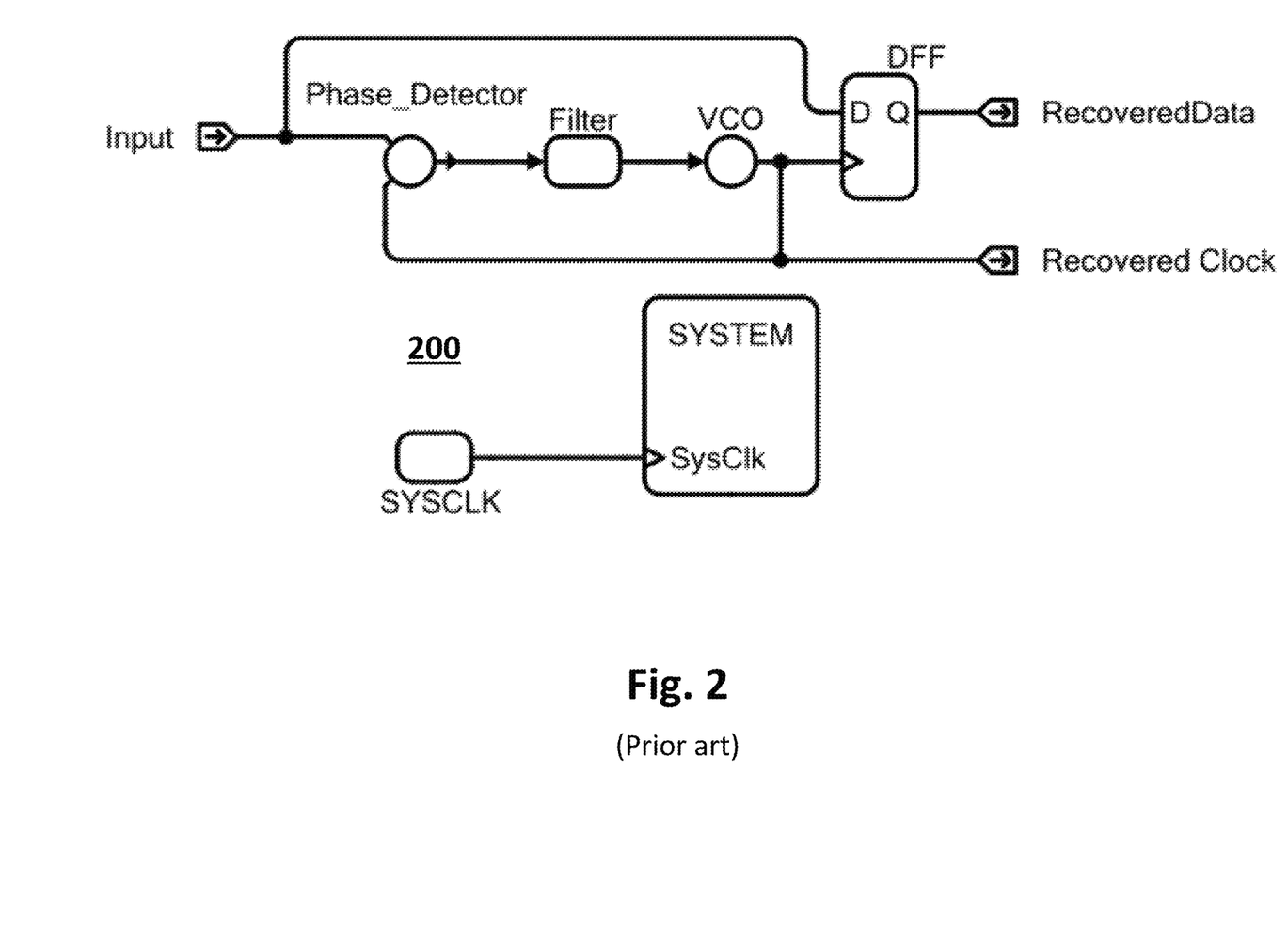
FIG. 2 is another diagram of a phase-locked loop as is known in the prior art.

However, as above, a device or system typically has a system or master clock. FIG. 2 is a diagram of a prior art sub-system 200 of a larger system; the larger system is the device that is intended to make use of the asynchronous data. Sub-system 200 contains a PLL as shown in FIG. 1, and a system clock that drives the larger system that contains sub-system 200. The system clock is, for example, often a crystal controlled precision clock.

Again as above, the PLL portion of sub-system 200 may correctly generate the "recovered clock" ("Recovered Clock" in FIG. 2) at the average or dominant frequency of the input stream, but the Recovered Clock generally will not have the same frequency as the system clock of sub-system 200. As a result, the recovered data from the input stream may need to be further processed to ensure that the system and the recovered data from the input stream remain in step with each other.

For example, the larger system containing sub-system 200 might be a precision audio digital-to-analog converter ("DAC"), and the asynchronous data stream may be the audio data that the DAC uses. The DAC system must receive data regularly, and to receive data regularly from an asynchronous data stream it may buffer the data into a first-in-first-out ("FIFO") memory and, if the memory fills too quickly, halt the data stream to prevent overflow. Similarly, if the FIFO memory is insufficiently full, the system may signal to the data source to speed up the delivery of data.

There are thus two issues to be resolved: the first is to find the clock that can sample the data (i.e., as is done by the prior art PLL of FIGS. 1 and 2), and the second is to somehow cause the average data rate used by the system to equal the average data rate delivered by the asynchronous input stream.

Figure 3:
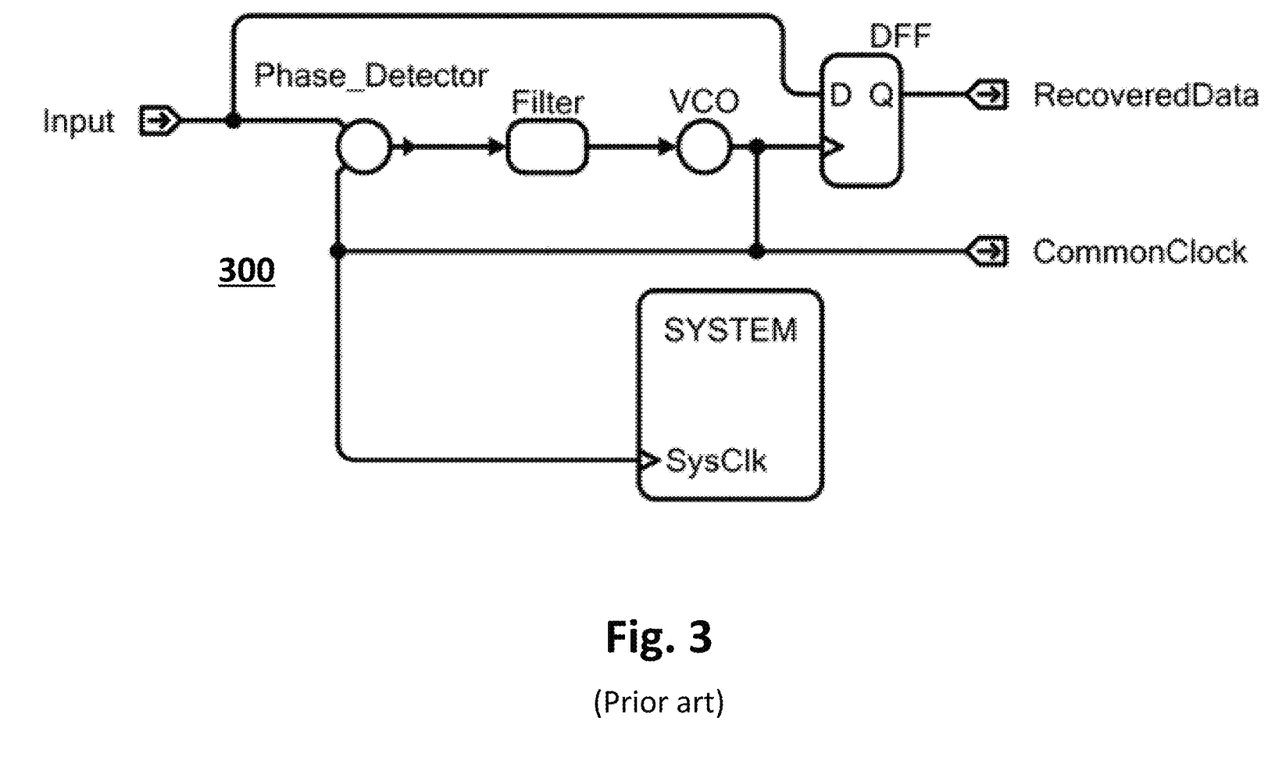
FIG. 3 is still another diagram of a phase-locked loop as is known in the prior art.

FIG. 3 is a diagram of one solution to such clock issues that is known in the prior art. In prior art sub-system 300 of FIG. 3, the recovered clock generated by the PLL is used as the system clock, and is thus now called "Common Clock" in FIG. 3.

Now there is only one clock in sub-system 300, so the average rate at which data is used by the system can remain at the correct average rate of the input stream, i.e., the system can consume data at the same rate at which the data is provided. This does not require any FIFO process, or any signaling back to the data source to adjust the data rate.

However, again as above, jitter may be present in the phase detector and/or the VCO that is within the PLL may be troublesome, possibly perceptible as a degradation of the recovered data from the input signal, and the other issues described above with respect to PLLs may arise. For these reasons, many prior art system designers expend a great deal of effort in designing the PLL and the filter in the PLL to minimize jitter and such other issues.

For example, it is recognized in the art that the jitter performance of any PLL design, however carefully constructed, cannot exceed the jitter performance of a fixed frequency source. Thus, in audio systems of the highest precision a fixed clock with very low phase noise is used as the master clock. The problem of synchronizing the average data rate is solved by the use of a signaling system that is able to halt or accelerate the data delivery (such as, for example, USB Audio), or, alternatively, if the data consuming device is unable to affect the rate of data delivery, by an Asynchronous Sample Rate Convertor ("ASRC"). An ASRC is a known digital mechanism that attempts to render into the system clock domain, as accurately as possible, a representation of the asynchronous data being delivered real time to the system.

A digital solution that can recover the data in the asynchronous input stream at its dominant frequency but is still based on a system clock avoids these issues.

Figure 4:
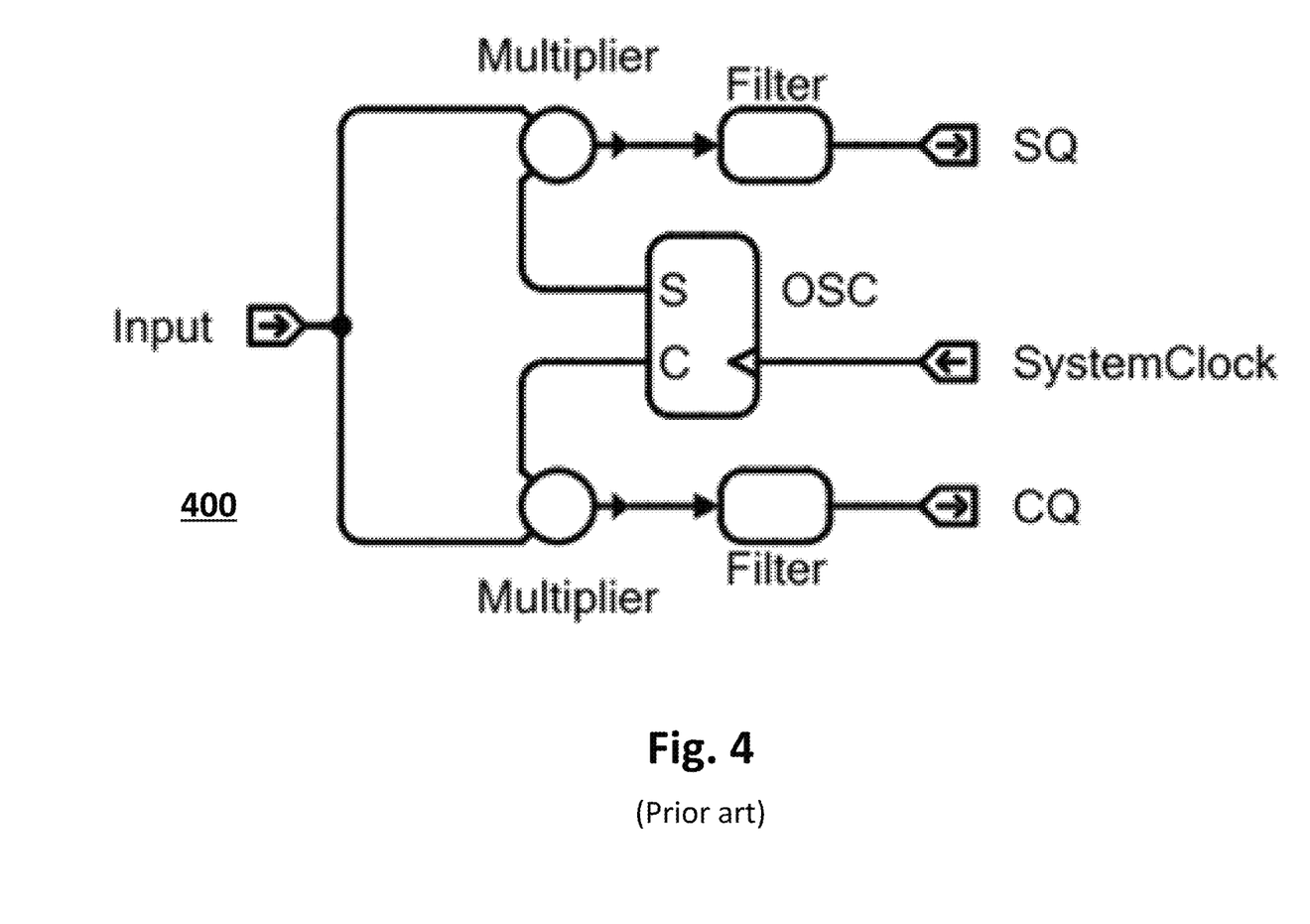
FIG. 4 is a diagram of a resolver as is known in the prior art.

FIG. 4 is a diagram of a quadrature resolver circuit 400 known in the prior art; while quadrature resolver 400 is also sometimes called a "phase detector," "quadrature detector," "lock in amplifier," or other similar terms, it is believed that it has not been used as a phase detector in a PLL. As illustrated here, quadrature resolver 400 contains a quadrature sinusoidal frequency oscillator OSC driven by a system clock, a pair of multipliers, and a pair of low pass filters.

Oscillator OSC provides a sine signal and a cosine signal, in the form of discrete pulses that define a sine and cosine curve, respectively; as will be explained, the frequency of oscillator OSC is selected to be the expected dominant frequency of the input data stream. The sine and cosine signals (i.e., the pulses) are multiplied by the input signal, and the products from the multipliers are filtered by the low pass filters. As will also be explained, the frequency allowed by the low pass filters is selected to be below the frequency of oscillator OSC.

The resulting signal SQ is the sine component of the input signal, and signal CQ is the cosine component (i.e., shifted 90 degrees in phase from the sine) of the input signal. The frequency of the signals SQ and CQ is at the frequency of the oscillator OSC, plus or minus the range of the low pass filters. These signals may be further processed to reconstitute a desired portion of the input data stream as described herein.

Figure 5:
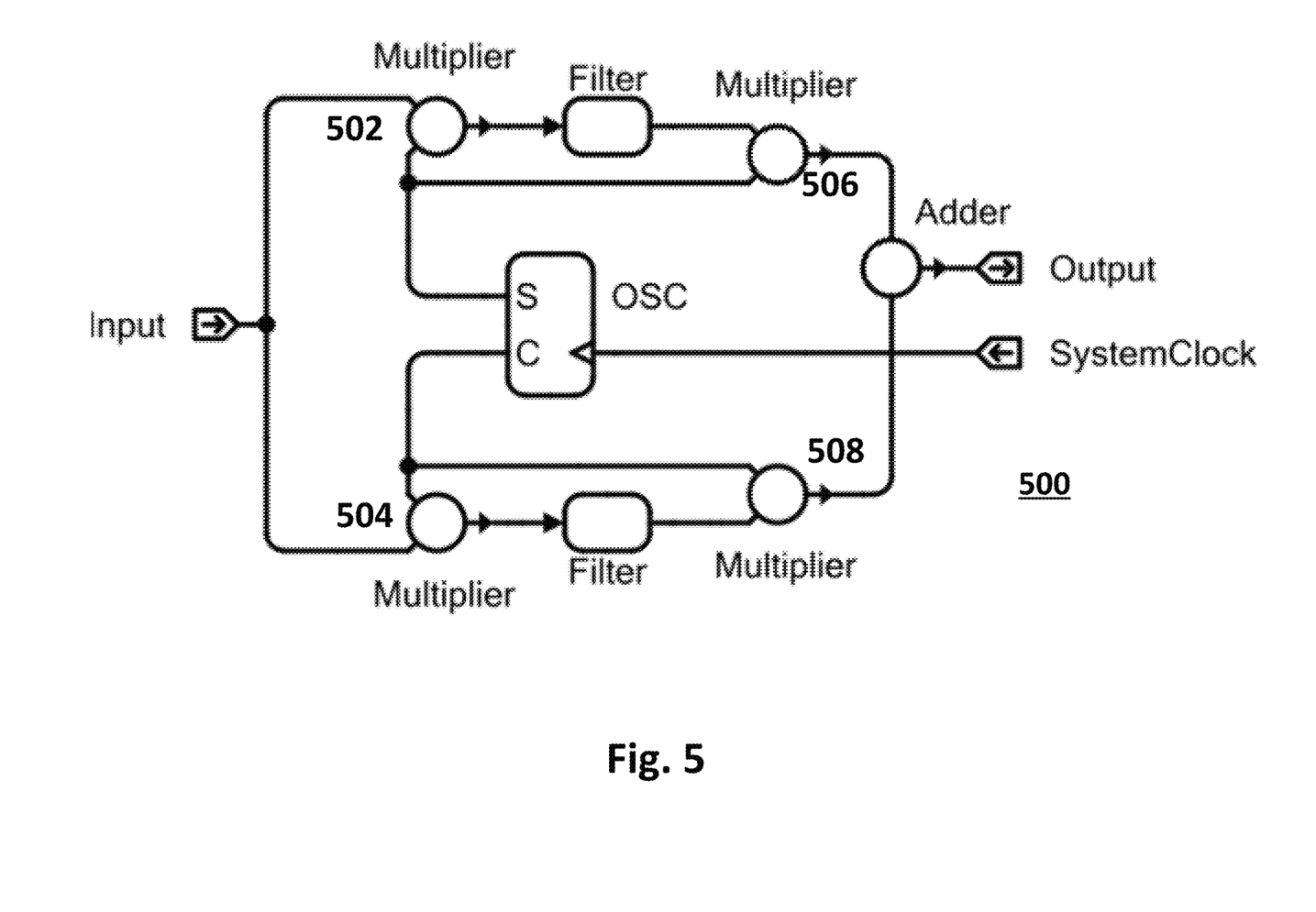
FIG. 5 is a diagram of a circuit for asynchronous data recovery according to one embodiment.

According to one embodiment, quadrature resolver 400 may be implemented in a configuration shown in FIG. 5. Circuit 500 of FIG. 5 is somewhat similar to quadrature resolver 400 of FIG. 4, but adds an additional pair of multipliers 506 and 508. Circuit 500 is also similar to the known in the art Weaver architecture, but with at least one significant difference in that circuit 500 uses the same sine and cosine frequencies from the oscillator OSC, while the Weaver architecture has a second oscillator that generates sine and cosine signals.

In circuit 500, the sine and cosine portions of the input signal, SQ and CQ as shown in FIG. 4, are again multiplied by the sine and cosine signals from oscillator OSC. The results of these multiplications are then added to obtain an output signal; if the frequency of oscillator OSC and the range of the low pass filters are correct, the output will contain the input data at the average or dominant frequency of the input data stream, without other extraneous frequencies.

As an example, assume that the input data stream is expected to have a dominant frequency of 10 kilohertz (KHz), but actually has a dominant frequency of 9 KHz. Oscillator OSC generates the expected 10 KHz frequency. As is known in the art, when multipliers 502 and 504 multiply the 10 Khz signal from oscillator OSC by the 9 KHz input signal, two signals result from each multiplier, one signal being the sum of those two frequencies, i.e., 19 KHz, and one signal being the difference between those two frequencies, i.e., 1 KHz.

As in the Weaver architecture, only the 1 KHz signal is to be used in the present approach, and so low pass filters 502 and 504 are set to pass frequencies below some frequency that is less than that generated by oscillator OSC. For example, low pass filters 502 and 504 might be set to pass only signals at frequencies under 5 KHz. Thus, the 19 KHz signals will not pass through low pass filters 502 and 504, and only the 1 KHz signals from multipliers 502 and 504 are presented to multipliers 506 and 508.

Multipliers 506 and 508 multiply the 1 KHz signals by the 10 KHz signals from oscillator OSC. This again results in signals of two frequencies from each multiplier 506 and 508, one being the sum of the two frequencies, i.e., 11 KHz, and one being the difference between the two frequencies, i.e., 9 KHz.

The signals from multipliers 506 and 508 are then added together by an adder. As will be apparent to one of skill in the art, multiplying an input data stream having a sine wave of a dominant frequency through circuit 500 and adding the outputs of multipliers 506 and 508 will result in a sine wave at the same frequency, and double the amplitude, as the dominant frequency sine wave of the input data stream, with other frequencies now removed. The cosine signal created by the oscillator OSC will cancel out.

It will be seen that the effect of the low pass filters is to allow for some variation in the actual dominant frequency of the input data stream. In the example above, this allows circuit 500 to reproduce a 9 KHz input frequency when the expected frequency is 10 KHz. One of skill in the art will easily be able to select appropriate values for the low pass filters as desired for a particular application.

Multipliers 502 and 504 and the two low pass filters may be thought of as an "analysis" section of the circuitry in which signals around the frequency of oscillator OSC, plus-or-minus the low pass filter bandwidth, are sought. The outputs of additional multipliers 506 and 508 may be thought of as a "synthesis" section of the circuitry, in which components of the input signal are added to re-create a portion of the input signal, the portion being that part of the input signal that is within the low pass filter bandwidth of the frequency of oscillator OSC.

The result of circuit 500 is an output that is at the same frequency as the dominant frequency of the input data stream, with other frequencies removed. In effect, circuit 500 operates as a high-Q, or narrow-band, filter.

As above, the frequency of the sine and cosine signals generated by oscillator OSC is set to be the expected dominant frequency of the input data stream. Many encoding formats use a preselected frequency; some formats embed information about that frequency in the data stream and have an initial "run-in" sequence of data so that a PLL can lock on to the frequency.

If the encoding format of the expected input data stream is known, then the frequency of the data will be known and the oscillator OSC can be set to provide the appropriate frequency. Further and as such, in the circuit 500 of FIG. 5, no run-in sequence is needed.

As another example, consider the design of a circuit intended to receive a signal using the Sony/Philips Digital Interface ("SPDIF") format. SPDIF is a type of digital audio interconnect used in consumer audio equipment, such as components in home audio theaters and other digital high-fidelity systems, to output audio over reasonably short distances.

A SPDIF signal is an asynchronous, serial data stream that has a dominant frequency of 128 times the audio sample rate. In a common case, CD audio data at 44,100 samples per second, this results in a frequency of 5.645 megahertz (MHz). A PLL of the known art, such as PLL 100 in FIG. 1 above, would be designed to lock on to the 5.645 MHz frequency and the output of the VCO in PLL 100 would be used to clock the data. (Another common case of the SPDIF format is for Digital Audio Tape ("DAT") at 48,000, 44,100, or 32,000 samples per second, which result in frequencies of 6.144 MHz, 5.645 MHz, or 4.096 MHz, respectively. Most or all formats defined by an industry specification will define a frequency and/or a sampling rate.)

Using the technique described herein with a circuit such as circuit 500, a system having a system clock operating at, for example, 40 MHz will cause oscillator OSC to generate quadrature sine and cosine signals at 5.645 MHz; this may, for example, be done using the known coordinate rotation digital computer ("CORDIC") method of sine wave generation in a digital system (also known as Volder's algorithm).

The sine and cosine waves in the 40 MHz system clock are not phase locked to the SPDIF data, but the low pass filters of circuit 500, which may be set to a bandwidth of 1 KHz, thus allow for re-synthesis of the dominant signal of 5.645 MHz plus or minus 1 KHz, in the 40 MHz domain. One of skill in the art will appreciate that this is not a continuous time signal at the 5.645 MHz SPDIF dominant frequency, but rather is a digital rendering of that signal in the 40 MHz clock domain.

There will be some jitter due to the fact that sine wave zero crossings of the 5.645 MHz sine wave are on average correct, but are on the edges of the 40 MHz system clock and thus quantized to 25 ns intervals; however, the low pass filters smooth this out and the adder outputs a non-jittery sine wave. Despite the fact that the SPDIF signal is complex and has many frequency components in it, the present technique and circuit finds the dominant 5.645 Mhz signal, while allowing for any frequency and phase errors it may have, directly in the 40 Mhz domain. No locking of any local oscillator (digital or analog) is needed.

As above, the low pass filters allow for some tolerance of the frequency of the input data stream that is to be re-created. The specification for the SPDIF format is very exacting, and thus 5 KHz bandwidth low pass filters as described above are expected to adequately allow any variations in the nominal 5.645 MHz frequency of the input data stream. The specification of frequency for other applications, for example, a CD player, are less strict, and thus low pass filters passing a broader bandwidth may be appropriate. One of skill in the art will be able to select appropriate low pass filters for a particular application.

Figure 6:
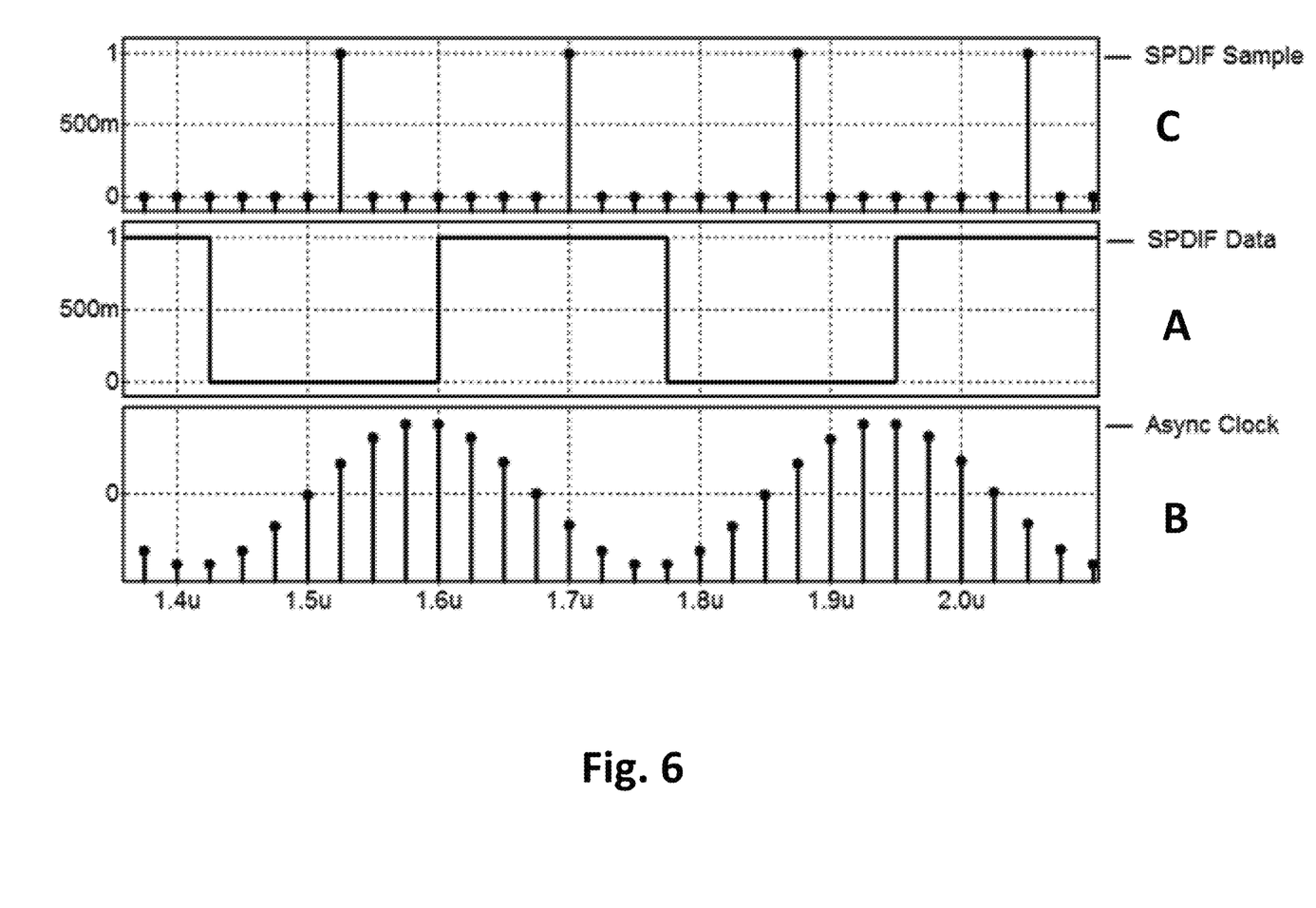
FIG. 6 is a graph of signals in a circuit for asynchronous data recovery such as that of FIG. 5.

FIG. 6 is a graph of some of the signals in a circuit such as circuit 500 of FIG. 5 in which SPDIF data is recovered, where the system clock runs at 40 MHz as above.

The graph labeled A in FIG. 6 is an input stream of SPDIF data; as shown here it is a square wave that changes from 0 to 1 or from 1 to 0 with a frequency of 5.645 MHz, or about every 177 ns.

A 40 MHz system clock generates a pulse every 25 nanoseconds (ns) as shown in graph B in FIG. 6. The amplitude of each pulse is selected, for example using the CORDIC method as above, to create an envelope of a sine wave at the SPDIF frequency, i.e., an asynchronous clock. It may be seen in graph B of FIG. 6 that the pulses occur every 25 ns, i.e., at the rate of the 40 MHz clock, while the envelope of the sine wave is at the same frequency as the SPDIF data, i.e., at a frequency of 5.645 MHz.

The SPDIF data in the input stream in graph A of FIG. 6 is thus phase locked to the asynchronous clock in graph B of FIG. 6. Each time the sine wave crosses zero, a sample of the SPDIF input stream is taken. Thus, graph C of FIG. 6 shows when a "recovered clock" signal is sent to a device, such as a DFF, causing that device to take a sample of the SPDIF input stream (i.e., when the pulses in graph C are at a value of 1). It will be seen that these points correspond to the zero values of the sine wave in graph B; however, the samples are actually taken one cycle of the 40 MHz system clock after the sine wave reaches zero, due to the delay in the crossing of the zero value propagating through the elements of circuit 500.

Figure 7:
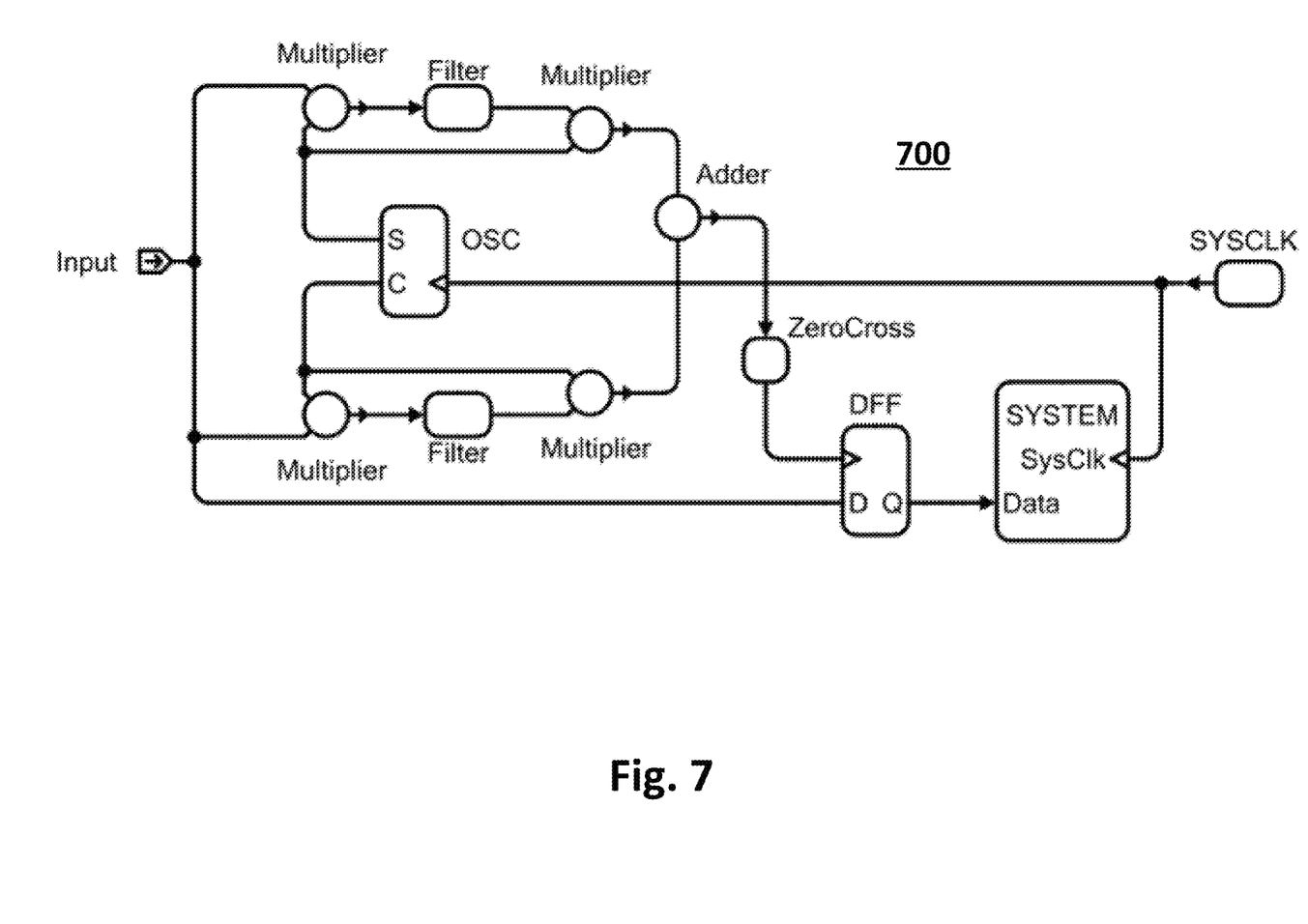
FIG. 7 is a diagram of a circuit for asynchronous data recovery according to another embodiment.

FIG. 7 is a diagram of a circuit 700 that incorporates circuit 500 of FIG. 5. The output of the adder is passed to a zero cross detector; when the zero cross detector determines that the sine-wave asynchronous clock signal has crossed zero, a clock signal is generated which causes the DFF to take a sample of the input stream, and the data from the sample is sent to the system.

The entire circuit 700 operates as a state machine in the domain of the system clock; as above, the system clock may be a low phase noise, fixed frequency clock. No PLL or analog components are required, and no frequency needs to be separately synthesized from the system clock. Circuit 700 thus does not suffer from the problems that may arise in a PLL-based system as described above. Circuit 700 can operate on any asynchronous bi-phase encoded signal streams, such as those in the SPDIF format, on any asynchronous sigma-delta single bit stream, and on other formats such as Direct Stream Digital ("DSD"), or on any high-speed serial data.

The apparatus and technique described herein has another benefit and use. The Weierstrass transform of a function f(x) is a "smoothed" version of f(x) obtained by averaging the values of the function f, weighted with a Gaussian centered at x. A similar process can be used to render a signal in one clock domain (the input clock domain) into another signal in another clock domain (the output clock domain) if a means to generate a suitable Gaussian impulse at the rate of the input clock can be found.

The circuit described herein may be used to generate such a Gaussian impulse at the rate of the input clock domain rate, in the output clock domain. Once this is done, simple multiplication of the synthesized Gaussian pulse in the output clock domain by the input sample amplitude is sufficient to accurately render the input signal into the output clock domain.

It is further possible to parallelize the Gaussian pulses in the output clock domain into multiple channels such that the rate of input clock may exceed that of the output clock; this allows for effectively filtering and down-sampling the signal from the high rate input clock domain into the lower rate output clock domain.

As above, the output of the adder of circuit 700 of FIG. 7 is a sequence of pulses that define the envelope of a sine wave at the rate of the input signal, as seen in curve B of FIG. 6.

Figure 8A:
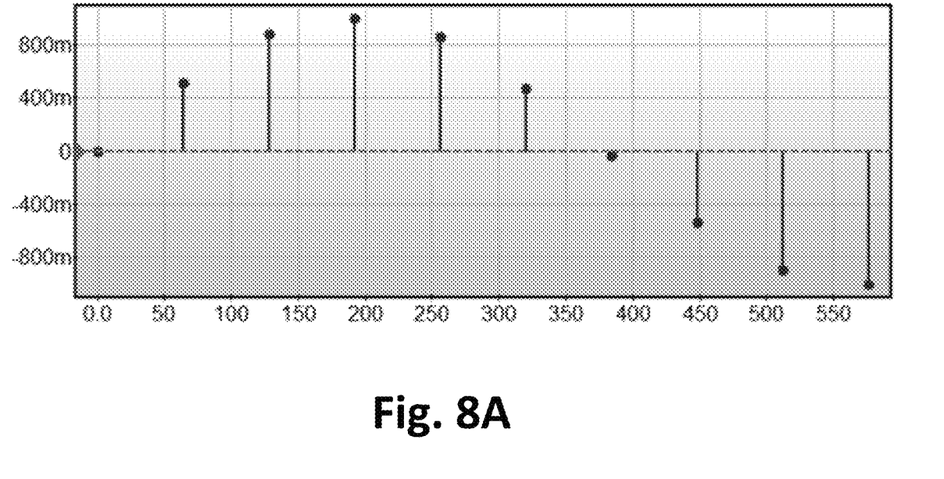
FIG. 8A is a graph of a sampling clock signal in a circuit for asynchronous data recovery such as that of FIG. 5.

FIG. 8A shows an example of the output of an adder in a circuit such as circuit 700 of FIG. 7, in which a "recovered clock" pulse occurs every 64 pulses of the system clock. The recovered clock pulses define a sine wave at 1/64 the frequency of the system clock. Each pulse may be considered to be the product of a Dirac Delta function, an infinitely thin pulse that is a Gaussian with a standard deviation of zero, and an amplitude. When the input data stream is at the same rate as the recovered clock, or some integer fraction thereof (i.e., every 128 pulses of the system clock, 192, etc.), all of the missing samples can be filled in with zeros and the output data is mathematically correct.

Figure 8B:
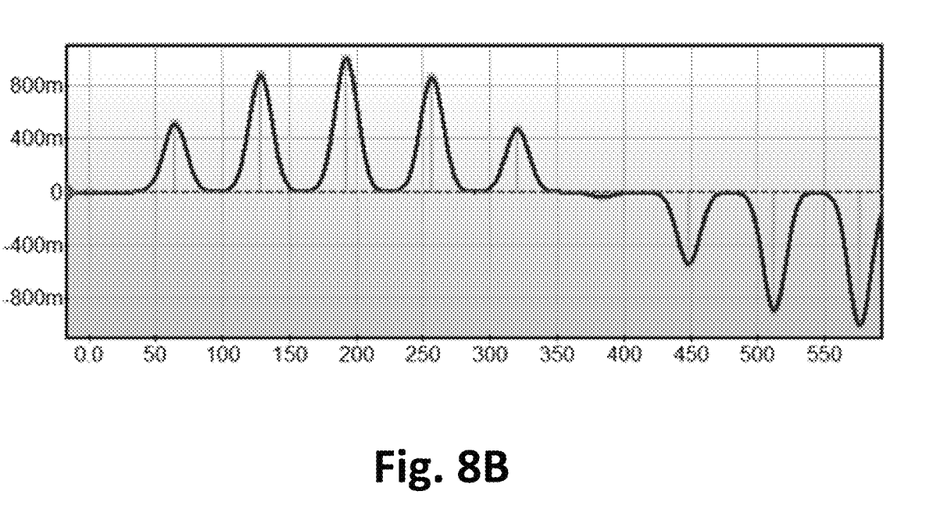
FIG. 8B is a graph of a sampling clock signal in a circuit for asynchronous data recovery such as that of FIG. 5 in which the clock pulses are Gaussians of non-zero width.

Now assume that the standard deviation of the pulse of the recovered clock is not zero, i.e., the pulses have a finite width but are still Gaussian. FIG. 8B shows an example of what such a recovered clock signal would look like. When this clock is used to sample data at the rate of the recovered clock (or an integer fraction thereof), there is no effect; the same data results, at the same signal/noise ratio, etc.

Figure 9:
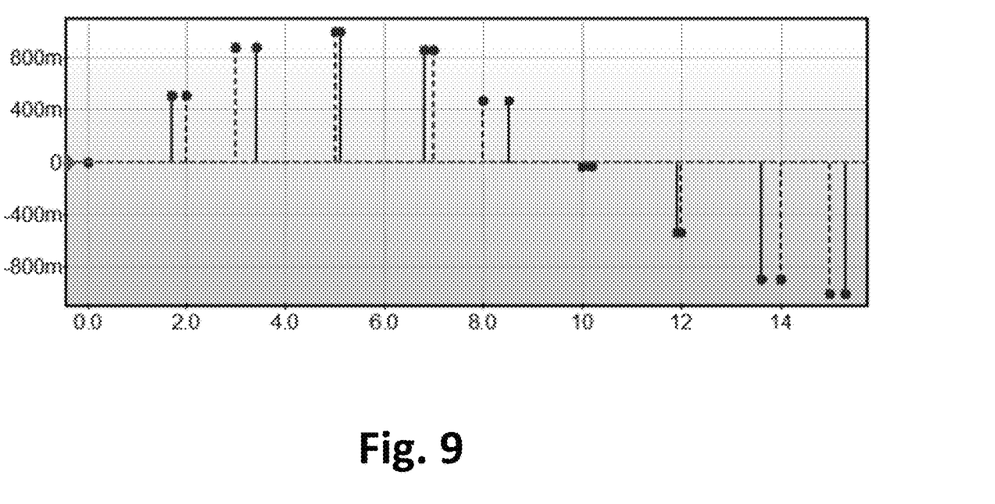
FIG. 9 is a graph of an asynchronous input data stream compared to a sampling clock such as that of FIG. 8.

FIG. 9 shows an input data stream (the solid lines) that is not at the same rate as the recovered clock (the dashed lines), and is thus asynchronous. If the system cannot lock the input data stream to the clock frequency, artifacts will be present in the data representation in the system clock domain due to the asynchronously arriving data samples being "snapped" to the nearest available clock pulse. Because data is arriving asynchronously, the timing of the data is mathematically between the system clock pulses. The system cannot represent data on anything but the clock edges, so the process of moving the ideal incoming data sample to the nearest available clock edge in the system clock represents an error in time, which translates to an error in amplitude depending on the rate of change of the input asynchronous signal. Consequently, noise and artifacts are present in the data rendered into the system clock domain when the input data is not synchronous to the system clock.

Figure 10:
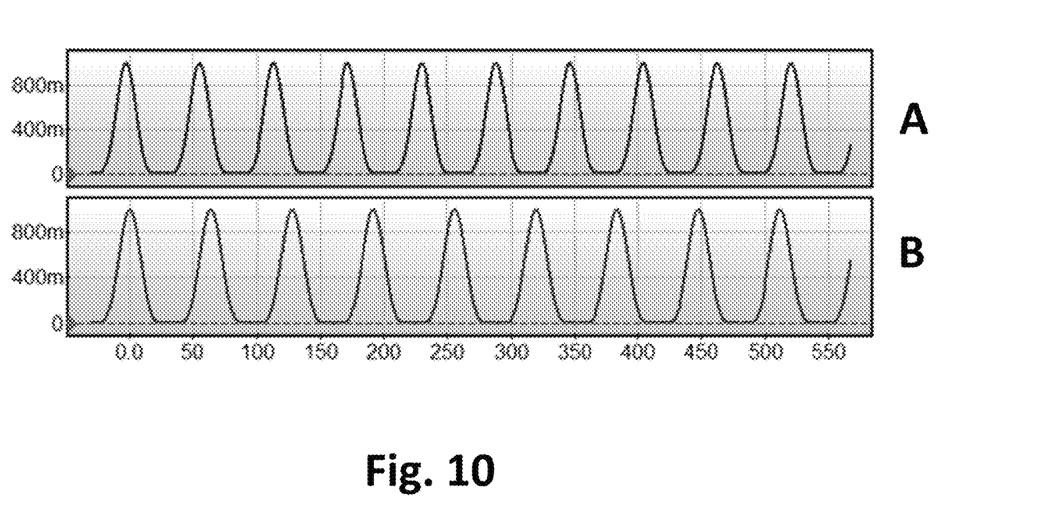
FIG. 10 is a graph of the asynchronous input data stream and sampling clock of FIG. 9 in which the pulses are Gaussians of non-zero width.

FIG. 10 is an illustration of data arriving over an asynchronous connection. Rather than represent the arriving data as a single impulse, i.e., a Dirac Delta function in the system clock domain that may or not be ideal on the system clock edge, the data has been "blurred" into a Gaussian shape. The peak of these Gaussian signals represents the mathematically ideal arrival time of the asynchronous signal. Signal A in FIG. 10 shows data arriving every 64 pulses of the system clock, and the data is thus synchronous to the system clock, resulting in the peak of each Gaussian pulse of signal A of FIG. 10 being on a system clock edge. The signal B in FIG. 10 shows data arriving every 58.182 pulses of the system clock, and thus the peak of each Gaussian pulse is not synchronous with any system clock edge. Nevertheless, the Gaussian pulse extending over a plurality of system clock edges is able to represent a peak that is not on a system clock edge. The signal in the system clock domain, which now consists of a sequence of finite width Gaussian pulses (as compared to the known art where the signal is a sequence of Dirac Delta functions which are mathematically Gaussians of zero width), does not show any noise or artifacts due to its asynchronous nature.

Figure 11:
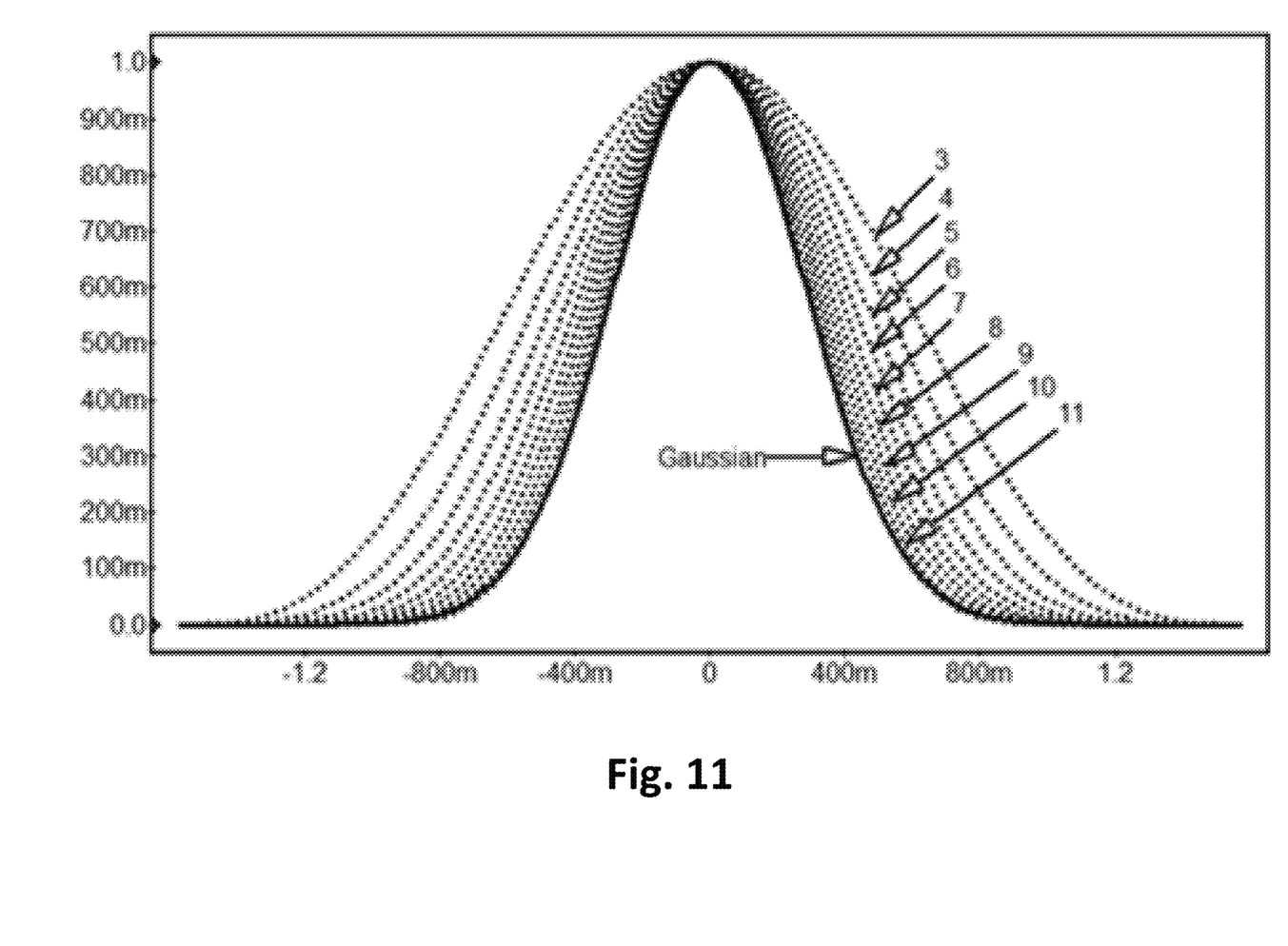
FIG. 11 is a graph illustrating how a Gaussian may be approximated by raising a cosine wave to a power.

To accomplish this, it is thus desirable to turn a pulse into a Gaussian. A Gaussian with a standard deviation that is not zero has a different shape than a sine or cosine wave. However, as is known in the art, a sine or cosine raised to a power, i.e., $\sin(x)^N$ or $\cos(x)^N$, approximates a Gaussian in the limit as the power N tends to infinity. An example of this is shown in FIG. 11; the innermost, solid curve in the figure shows a Gaussian, while the various dashed lines show a sine or cosine raised to the various indicated powers. As a practical matter, the sine wave output of the adder raised, for example, to the power 8 will generate a sufficiently accurate Gaussian pulse with more than 180 decibels (dB) of accuracy. One of skill in the art will appreciate that higher levels of accuracy may be achieved by sharpening the Gaussian pulses further, by raising the sine wave output to a higher power.

Figure 12:
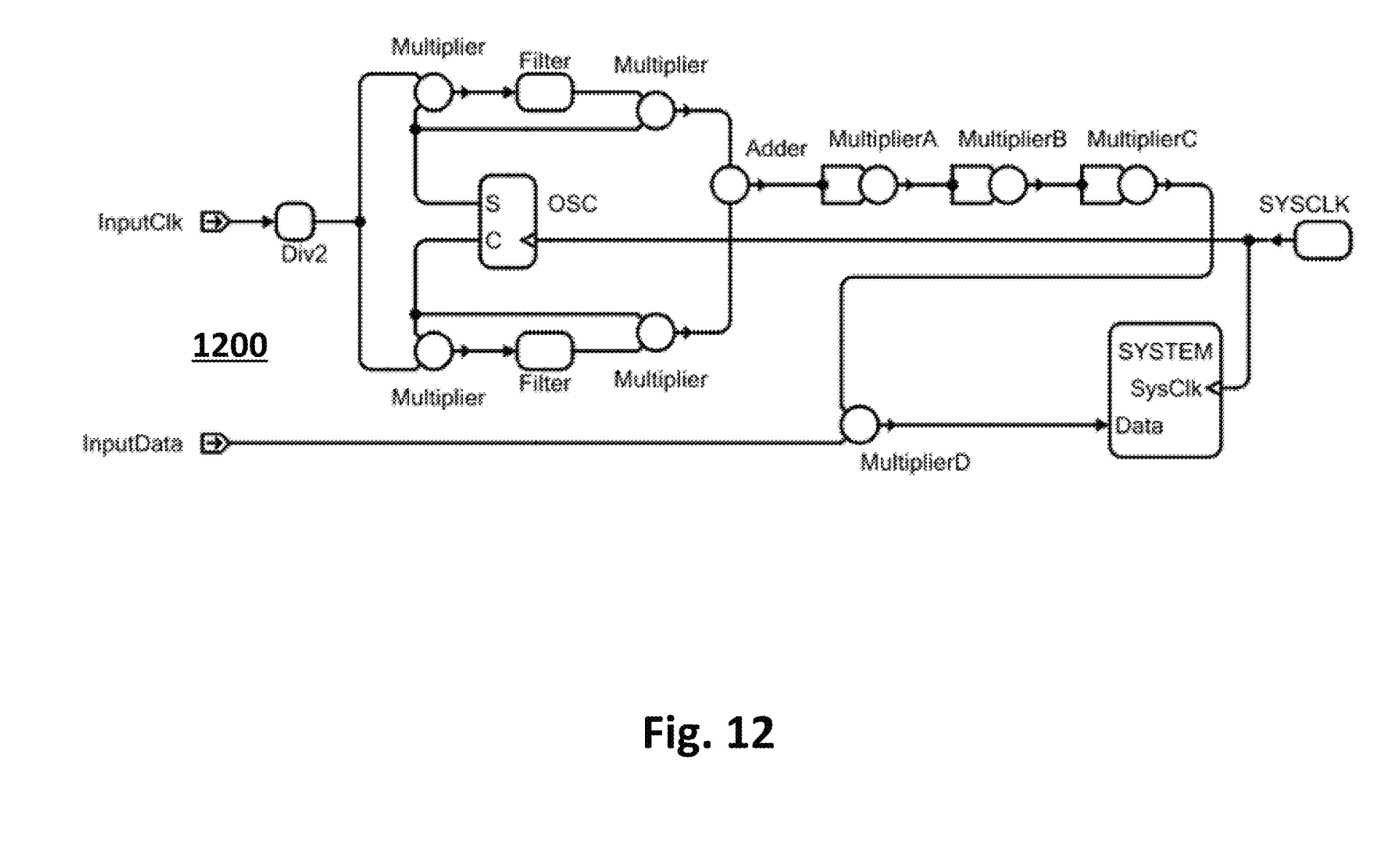
FIG. 12 is a diagram of a circuit for asynchronous data recovery according to still another embodiment.

FIG. 12 shows a circuit 1200 in which a circuit such as circuit 700 of FIG. 7 has been modified by the addition of multipliers A, B and C that raise the sine wave output of the adder to a power of 8, thus creating a sequence of Gaussian pulses at the output of multiplier C at the rate of the input data clock. However, now the input to the portion of circuit 1200 that is similar to circuit 700 is not the input data stream, but an input clock signal, a stream of bits where each bit indicates that new data is available on a separate input data bus. The frequency of the input clock signal is thus the frequency at which new data appears, and is generally the same as the sampling rate that is used to obtain the input data. Note that the input clock frequency is divided by 2 by a frequency divider, because multiplier A doubles the dominant frequency of the input data signal.

The input data that is synchronous with the input clock is then multiplied by the Gaussian pulse stream in multiplier D and creates the signal represented by the input data in the system clock domain.

Consider again the case of a SPDIF signal. One type of data commonly transmitted using the SPDIF format is CD audio data at 44,100 samples per second. In the example above, this results in a data stream with a frequency of 5.645 megahertz (MHz). Using circuit 700 of FIG. 7 will result in a decoded data stream, but there will be some jitter due to the fact that sine wave zero crossings of the 5.645 MHz sine wave are on average correct, but are on the edges of the 40 MHz system clock and thus quantized to 25 ns intervals. As a result, the 44,100 samples per second data will be seen on the clock edges of the 40 MHz system clock.

However, the SPDIF format uses packets of 64 bits. Thus, rather than look for a dominant frequency of the bit of data, it is possible to use the frequency of the packets, and thus the frequency of the input clock signal, to choose the oscillator frequency for circuit 1200 of FIG. 12. If oscillator OSC produces a frequency of 44.1 KHz, the rate of the packets, multiplier A will double the frequency and there will be too many Gaussians, i.e., twice as many Gaussians as the number of packets. Thus, oscillator OSC is set to generate 22.05 KHz, so that the output from the adder is also at 22.05 KHz, but the output from multiplier A is at 44.1 KHz as desired. As in FIG. 5 above, the clock from oscillator OSC is a bit jittery, but again the low pass filters smooth this out and the adder outputs a non-jittery sine wave at 22.05 KHz.

Multiplier A doubles the frequency of the output of the adder from 22.05 KHz back to 44.1 KHz, and multipliers B and C "sharpen" the sine wave peaks to Gaussians, as shown in FIG. 11 above. Multiplier D then multiplies the stream of Gaussian pulses by the input data, resulting in a signal that looks like FIG. 8B above.

Note that the Gaussians spend a number of clock cycles at zero between pulses; in fact, due to the relative phase of the input clock and the division of its frequency by 2, the Gaussians are constructed so that their peak is at the mathematically correct time between system clock pulses, and are thus at zero when data arrives at multiplier D. Thus, the change in input data occurs when the Gaussians are at a value of zero; if this were not the case, the position of the data change would affect the output. This "masks" the edge of the data change so that the system cannot determine where the edge is, and there is no artifact due to the asynchronous signal; the sequence of multiplied Gaussians, as in FIG. 8B, is thus mathematically the audio data of 44.1 KHz but in the 40 MHz system clock domain.

One of skill in the art will appreciate that the described technique may be used with different formats and different sampling rates. One of skill in the art will also appreciate that, as above, higher accuracy may be achieved by further sharpening the Gaussians, by adding additional multipliers between multiplier C and multiplier D.

In circuit 1200 the rate of the system clock is assumed to be significantly higher than the input clock, such that the Gaussian pulse is distributed over a number of system clock events. This constraint can, however, be removed by feeding the input data stream into some number n instances of circuit 1200 in a "round robin" fashion, and then adding the resulting n output streams, thus allowing the system clock to clock each instance of circuit 1200 at a rate less than that of the input clock. Such parallelization of circuit 1200 further has the advantage of down converting the input signal and filtering it. (One of skill in the art will appreciate that not all components need be duplicated, but rather that a single instance of some components, e.g., oscillator OSC, may be used by more than one instance of circuit 1200.)

For example, some signals used on the internet are at a frequency of 1 gigabit per second, so that a circuit 1200 would potentially have to run at a speed of as much as 40 gigabits per second. Parallelization can reduce this problem significantly.

By using these techniques, it is possible to construct a device that can recover asynchronous data without analog components, and while operating on a single system clock frequency.

The disclosed system has been explained above with reference to several embodiments. Other embodiments will be apparent to those skilled in the art in light of this disclosure. Certain aspects of the described method and apparatus may readily be implemented using configurations other than those described in the embodiments above, or in conjunction with elements other than or in addition to those described above.

For example, as is well understood by those of skill in the art, various choices will be apparent to those of skill in the art. Where components are shown as directly connected to one another, they may in some instances be coupled to one another through some other component. Further, the illustration of components and the associated feedback loops, oscillators, multipliers, adders, filters, etc., as well as other specific components, is exemplary; one of skill in the art will be able to select the appropriate number and type of components and related elements that is appropriate for a particular application.

These and other variations upon the embodiments are intended to be covered by the present disclosure, which is limited only by the appended claims.

What is claimed is:

1. A circuit comprising:
   an oscillator having a sine output configured to provide a sine signal at an expected frequency of an input signal and a cosine output configured to provide a cosine signal at the expected frequency of the input signal;
   a first multiplier having a first input coupled to the sine output of the oscillator and a second input configured to receive the input signal, and an output configured to provide a product of the sine signal and the input signal;
   a second multiplier having a first input coupled to the cosine output of the oscillator and a second input configured to receive the input signal, and an output configured to provide a product of the cosine signal and the input signal;
a first low pass filter having an input coupled to the first multiplier and an output configured to provide a first filtered signal;
a second low pass filter having an input coupled to the second multiplier and an output configured to provide a second filtered signal;
a third multiplier having a first input coupled to the sine output of the oscillator and a second input coupled to the output of the first low pass filter, and an output configured to provide a product of the sine signal and the first filtered signal;
a fourth multiplier having a first input coupled to the cosine output of the oscillator and a second input coupled to the output of the second low pass filter, and an output configured to provide a product of the cosine signal and the second filtered signal; and
an adder having a first input coupled to the output of the third multiplier and a second input coupled to the output of the fourth multiplier, and an output configured to provide a sum of the output of the third multiplier and the output of the fourth multiplier.

2. The circuit of claim 1 further comprising:
a zero cross detector having an input coupled to the output of the adder and an output configured to provide a zero cross signal indicating that the output of the adder has crossed a zero value.

3. The circuit of claim 2 further comprising:
a sampling device having a data input configured to receive the input signal and a clock input coupled to the output of the zero cross detector, and an output configured to provide a sample of the input signal when a zero cross signal is received.

4. The circuit of claim 3, wherein the sampling device is a D-type flip flop.

5. The circuit of claim 1 wherein the input signal has a format defined by an industry specification and the expected frequency of the input signal is a frequency defined by the industry specification.

6. The circuit of claim 5 wherein the format is a Sony/Philips Digital Interface ("SPDIF") format.

7. The circuit of claim 6 wherein the frequency defined by the SPDIF format is 5.645 megahertz.

8. The circuit of claim 6 wherein the frequency defined by the SPDIF format is 6.144 megahertz.

9. The circuit of claim 6 wherein the frequency defined by the SPDIF format is 4.096 megahertz.

10. The circuit of claim 5 wherein the format is a Direct Stream Digital ("DSD") format.

11. The circuit of claim 10 wherein the frequency defined by the DSD format is 2.8224 megahertz.

12. The circuit of claim 1 wherein the input data stream is comprised of asynchronous bi-phase encoded signals.

13. The circuit of claim 1 wherein the input data stream is an asynchronous sigma-delta single bit stream.

14. The circuit of claim 1 wherein the input data stream is a high-speed serial data stream.

* * * * *

UNITED STATES PATENT AND TRADEMARK OFFICE
CERTIFICATE OF CORRECTION

PATENT NO. : 10,637,640 B2
APPLICATION NO. : 16/517621
DATED : April 28, 2020
INVENTOR(S) : A. Martin Mallinson et al.

Page 1 of 1

It is certified that error appears in the above-identified patent and that said Letters Patent is hereby corrected as shown below:

In the Claims

Column 12, Line 24, Claim 12, replace "The circuit of claim 1 wherein the input data stream" with --The circuit of claim 1 wherein the input signal--.

Column 12, Line 26, Claim 13, replace "The circuit of claim 1 wherein the input data stream" with --The circuit of claim 1 wherein the input signal--.

Column 12, Line 28, Claim 14, replace "The circuit of claim 1 wherein the input data stream" with --The circuit of claim 1 wherein the input signal--.

Signed and Sealed this
Tenth Day of November, 2020

Andrei Iancu
*Director of the United States Patent and Trademark Office*